United States Patent [19]

Taguchi

[11] Patent Number: 5,251,175
[45] Date of Patent: Oct. 5, 1993

[54] SEMICONDUCTOR MEMORY DEVICE

[75] Inventor: Masao Taguchi, Kawasaki, Japan

[73] Assignee: Fujitsu Limited, Kawasaki, Japan

[21] Appl. No.: 849,353

[22] Filed: Mar. 11, 1992

[30] Foreign Application Priority Data

Mar. 13, 1991 [JP] Japan ................................. 3-47981

[51] Int. Cl.$^5$ ........................................... G11C 13/00
[52] U.S. Cl. ..................... 365/208; 365/207; 365/900
[58] Field of Search ............ 365/208, 900, 206, 182, 365/203, 207

[56] References Cited

U.S. PATENT DOCUMENTS 4,653,029 3/1987 Sato ..................................... 365/208
4,984,206 1/1991 Komatsu et al. .

FOREIGN PATENT DOCUMENTS 0323876 7/1989 European Pat. Off. .
0136811 6/1990 European Pat. Off. .
0371459 6/1990 European Pat. Off. .

*Primary Examiner*—Terrell W. Fears
*Attorney, Agent, or Firm*—Staas & Halsey

[57] ABSTRACT

A readout column gate comprises two [2] nMOS transistors. These nMOS transistors connect with corresponding bit lines at their respective gates, with corresponding data buses at their respective drains, and with common readout column selection line at their respective sources. The column driver sets the voltage of the readout column selection line to a voltage different than the voltage precharged to the bit lines when a column is selected. The improved readout column gate expedites a DRAM access without incurring an increase in the size of a chip area.

98 Claims, 10 Drawing Sheets

SEMICONDUCTOR MEMORY DEVICE

BACKGROUND OF THE INVENTION

1. Field of the Invention

This invention pertains to a semiconductor memory device comprising a memory cell array formed by a plurality of memory cell arrays arranged in a matrix form, in which the datum stored in a selected memory cell is read out through a pair of bit lines provided at each column of the memory cell array, a sense amplifier, a readout column gate, and a pair of data buses provided commonly for columns of the memory cell array.

2. Description of the Related Arts

FIG. 1 is a schematic circuit diagram of a conventional semiconductor memory device.

It shows, as an example, a dynamic random access memory (DRAM) in which a memory cell array 1 comprises a memory cell 2, an nMOS transistor 3, and a capacitor 4. The nMOS transistor 3 forms a cell selection switch, and the capacitor 4 forms a memory element.

The memory cell array 1 is connected to a row decoder 5 though a word line WL. BL and BLX are a pair of bit lines. 6 is a sense amplifier (S/A). A column gate 7 comprises nMOS transistors 8 and 9.

nMOS transistors 10 and 11 respectively for data buses DB and DBX are provided commonly for the columns of the memory cell array 1. 12 is a Vcc power supply, 13 is a data bus amplifier, CL is a column selection line, 14 is a column decoder, 15 is a column driver comprising a CMOS inverter, 16 is a pMOS transistor, and 17 is an nMOS transistor.

The pair of bit lines BL and BLX are precharged to Vci [=(Vcc−Vth)/2] [V], where Vcc is a power supply voltage and Vth is the threshold voltage of an nMOS transistor. All the nMOS transistors 3, 10, 11 and 17 are formed simultaneously and therefore have the same threshold voltage Vth. The column selection line CL with the power supply voltage Vcc [V] applied at a nonselection turns the pMOS transistor 16 ON and nMOS transistor 17 of the column driver 15 OFF. The column selection line CL with 0.0 [V] applied at a selection turns the pMOS transistor 16 OFF and nMOS transistor 17 of the column driver 15 ON.

FIG. 2 is a time chart for explaining the operations of the semiconductor memory device shown in FIG. 1.

When a high voltage (i.e. a "1" level) is stored in the capacitor 4 of the memory cell 2 of this DRAM, a selection of the memory cell 2 drives the word line WL and turns ON nMOS transistor 3. The high voltage (i.e. a "1" level) stored in the capacitor 4 of the memory cell 2 slightly raises the voltage of bit line BL. At this time, the voltage of bit line BLX remains the same.

A sense amplifier 6 is driven next to raise the voltage of bit line BL to Vci [V] and to lower the voltage of bit line BLX to 0.0 [V]. Then, the column decoder 14 drives the column selection line CL and turns ON nMOS transistors 8 and 9, thereby connecting bit lines BL and BLX respectively to data buses DB and DBX. As a result, the voltages of both bit line BL and data bus DB rise to Vci [V], while the voltages of both bit line BLX and data bus DBX fall to 0.0 [V]. The data bus amplifier 13 detects the changes in the voltages of the data buses DB and DBX, thereby allowing the high voltage (i.e. the "1" level) data to be read out, during which a current I flows from the Vcc power supply 12 to ground through nMOS transistor 11, data bus DBX, nMOS transistor 9, bit line BLX and the sense amplifier 6.

On the other hand, when a low voltage (i.e. a "0" level) is stored in the capacitor 4 of the memory cell 4, nMOS transistor 3 of the memory cell 2 being turned ON lowers the voltages of both bit line BL and data bus DB to 0.0 [V] and raises the voltages of both bit line BLX and data bus DBX to Vci [V].

To summarize the above, the DRAM has the content stored in the capacitor 4 of memory cell 2 to be read out through the bit lines BL and BLX, the sense amplifier 6, the column gate 7, the data buses DB and DBX, and the data bus amplifier 13.

However, the conventional DRAM shown in FIG. 1 does not allow the column gate 7 to be driven before driving the sense amplifier 6 because of its possible malfunctioning due to a dampening of an output signal from the memory cell 2 caused by the selection of the column gate 7 before driving the sense amplifier 6. This is because the capacitance of bit line BL for the memory cell 2 becomes the sum of the parasitic capacitance of bit line BL and that of data bus DB, which is about ten [10] times larger, if the column gate 7 is selected before driving the sense amplifier 6.

Also, the conventional DRAM shown in FIG. 1 does not allow the column gate 7 to be driven even after driving the sense amplifier 6 until the voltage differences from the bit lines BL and BLX reach a certain value. This is because the noises from the data buses DB and DBX (the voltages applied to the data buses DB and DBX) may cause the sense amplifier 6 to malfunction.

Hence, the conventional DRAM shown in FIG. 1 needs to be selected only after the voltage difference between the bit lines BL and BLX reaches a certain value. This results in a problem of requiring a certain amount of time before selecting the column gate 7 after driving the sense amplifier 6, which delays its access.

FIG. 3 is a schematic circuit diagram of another conventional semiconductor memory device.

This shows the configuration of a DRAM for correcting the above described problem of the conventional DRAM shown in FIG. 1. Parts shown in FIG. 3 which are the same as those shown in FIG. 1 have the same numbers.

The DRAM shown in FIG. 3 has a readout column gate 18 and a write-in column gate 160 in lieu of the column gate 7 for the DRAM shown in FIG. 1. The readout column gate 18 comprises four [4] nMOS transistors 19, 20, 21 and 22, and the write-in column gate 160 comprises two [2] transistors 161 and 162.

nMOS transistor 19 has connections with bit line BL at its gate, with readout data bus DBR at its drain D, and with a drain D of nMOS transistor 20 at its source S. nMOS transistor 20 has connections with readout column selection line CLR at its gate, and with ground at its source S.

Furthermore, nMOS transistor 21 has connections with bit line BLX at its gate, with readout data bus DBRX at its drain D, and with drain D of nMOS transistor 22 at its source S. nMOS transistor 22 has connections with readout column selection line CLR at its gate, and with ground at its source S.

In addition, nMOS transistor 161 has connections with write-in column selection line CLW at its gate, with bit line BL at its source S, and with write-in data bus DBWX at its drain D. nMOS transistor 162 has connections with write-in column selection line CLW at its gate, with bit line BLX at its source S, and with write-in data bus DBW at its drain D.

As a result of reconfiguring the column gate 7 shown in FIG. 1 into the readout column gate 18 and the write-in column gate 160, on turning ON the readout column gate 18, the capacitance of bit line BL for memory cell 2 is equal only to the parasitic capacitance of bit line BL. Thus, unlike the conventional DRAM shown in FIG. 1, the conventional DRAM shown in FIG. 3 causes no effect due to the parasitic capacitance of data bus DB on the output voltage of the memory cell 2, thereby preventing output voltage of the memory cell 2 from being dampened.

Also, because the readout data buses DBR and DBRX does not connect to the readout column gate 18 through the sense amplifier 6, no matter what voltages the readout data busses DBR and DBRX carry before selecting the readout column gate 18, they have no effects on the sense amplifier 6.

As a result, the time difference between the timing for driving the sense amplifier 6 and that for driving the readout column gate 18 can be more liberally set. This in turn expedites a selection of the readout column gate 18 after driving the sense amplifier 6, thereby enabling a fast DRAM access.

Besides, the sense amplifier 6 need only drive the bit lines BL and BLX and need not drive readout data buses DBR and DBRX. Thus, the bit lines BL and BLX can rise and fall more rapidly, which is also instrumental in expediting the access.

However, the conventional DRAM shown in FIG. 3 has a problem of an increased chip area, because it is difficult to compactly arrange the large number of transistors forming the readout column gate 18 in a tiny chip in view of their interconnecting structures.

Because the readout column gate 18 and the writein column gate 160 need to be provided at each column, the problem of the increased chip area must be solved to miniaturize such a chip.

SUMMARY OF THE INVENTION

This invention is conceived to solve the problem of an enlarged chip area of a transistor forming a column gate required for expediting a DRAM access.

It aims at expediting a DRAM access without incurring an increase in the size of a chip area for a semiconductor memory device.

It is premised on a semiconductor memory device comprising a memory cell array formed by a plurality of memory cells arranged in a matrix form, in which the datum stored in a selected memory cell is read out through a pair of bit lines provided at each column of the memory cell array, a sense amplifier, a readout column gate, and a pair of data buses provided commonly for columns of the memory cell array.

The first form of this invention is as follows:

The readout column gate of the semiconductor memory device comprises first and second transistors. The controlling electrodes of the first and second transistors are connected respectively to one and the other of the pair of bit lines. The controlled electrodes of the first and second transistors on one side are connected respectively to one and the other of the pair of data buses. The controlled electrodes of the first and second transistors on the other side are connected commonly to the readout column selection line.

The semiconductor memory device further comprises a column driver for setting, at a column selection time, the voltage of the readout column selection line to a voltage different (i.e. lower or higher) than the precharged voltage of the pair of bit lines, and a column decoder for decoding a column address signal and for outputting to the column driver a signal indicating whether or not a column is selected.

The second form of this invention is as follows:

The readout column gate of the semiconductor memory device comprises first and second transistors. The controlling electrodes of the first and second transistors are connected respectively to one and the other of the pair of bit lines. The controlled electrodes of the first and second transistors on one side are connected respectively to one and the other of the pair of data buses. The controlled electrodes of the first and second transistors on the other side are connected commonly to the readout column selection line.

The semiconductor memory device further comprises a column driver for setting, at a column selection time, the voltage of the readout column selection line to a voltage, which does not turn on a transistor in an unselected column gate of the memory cell array, different (i.e. lower or higher) than the precharged voltage of the pair of bit lines, and a column decoder for decoding a column address signal and for outputting to the column driver a signal indicating whether or not a column is selected.

BRIEF DESCRIPTION OF THE DRAWINGS

Those skilled in the art can easily understand additional features and objects of this invention from the description of the preferred embodiments and the illustration of the attached drawings.

In the drawings.

DESCRIPTION OF THE PREFERRED EMBODIMENTS

Explanation of the Underlying Principle

Figure 4:
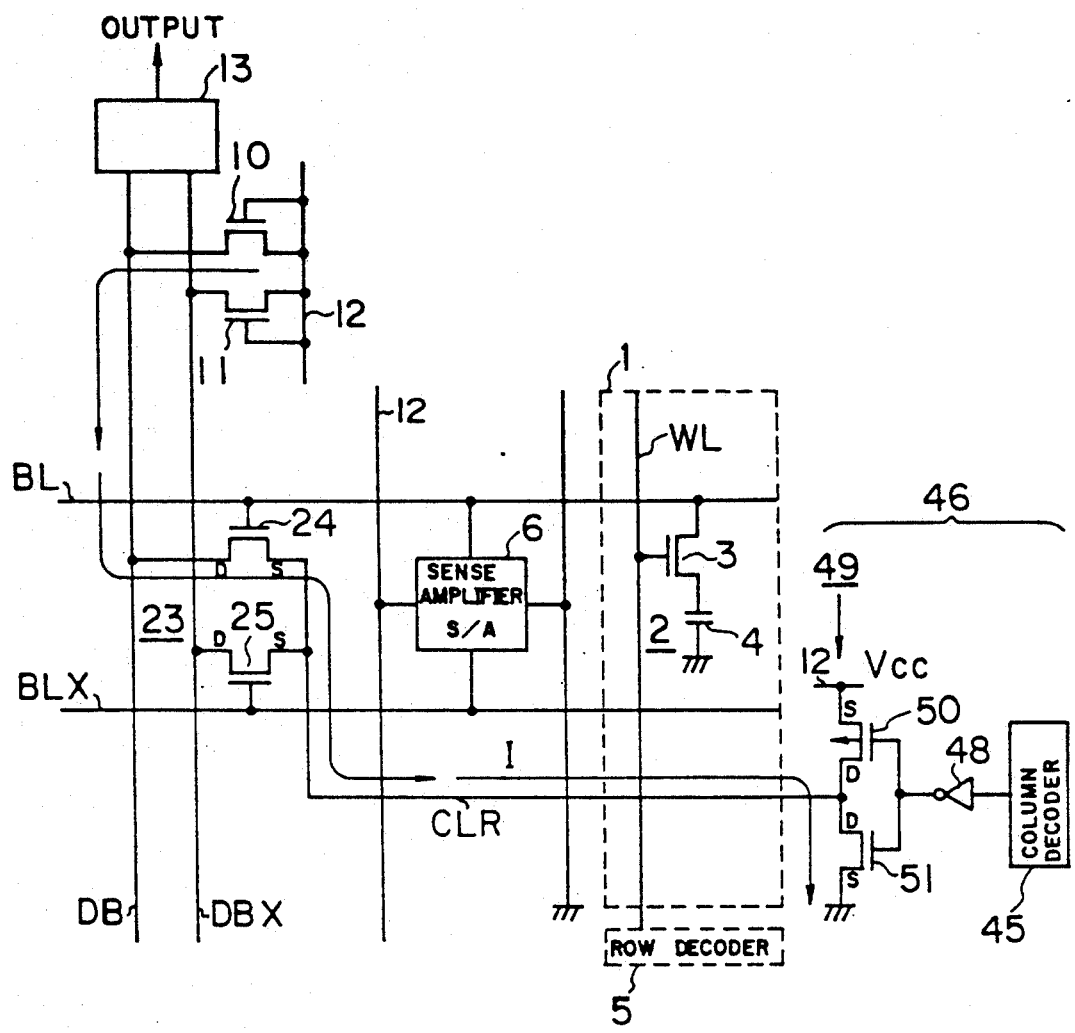
FIG. 4 is a schematic circuit diagram of a semiconductor memory device pursuant to this invention.

FIG. 4 is a schematic circuit diagram of a semiconductor memory device pursuant to this invention.

Figure 1:
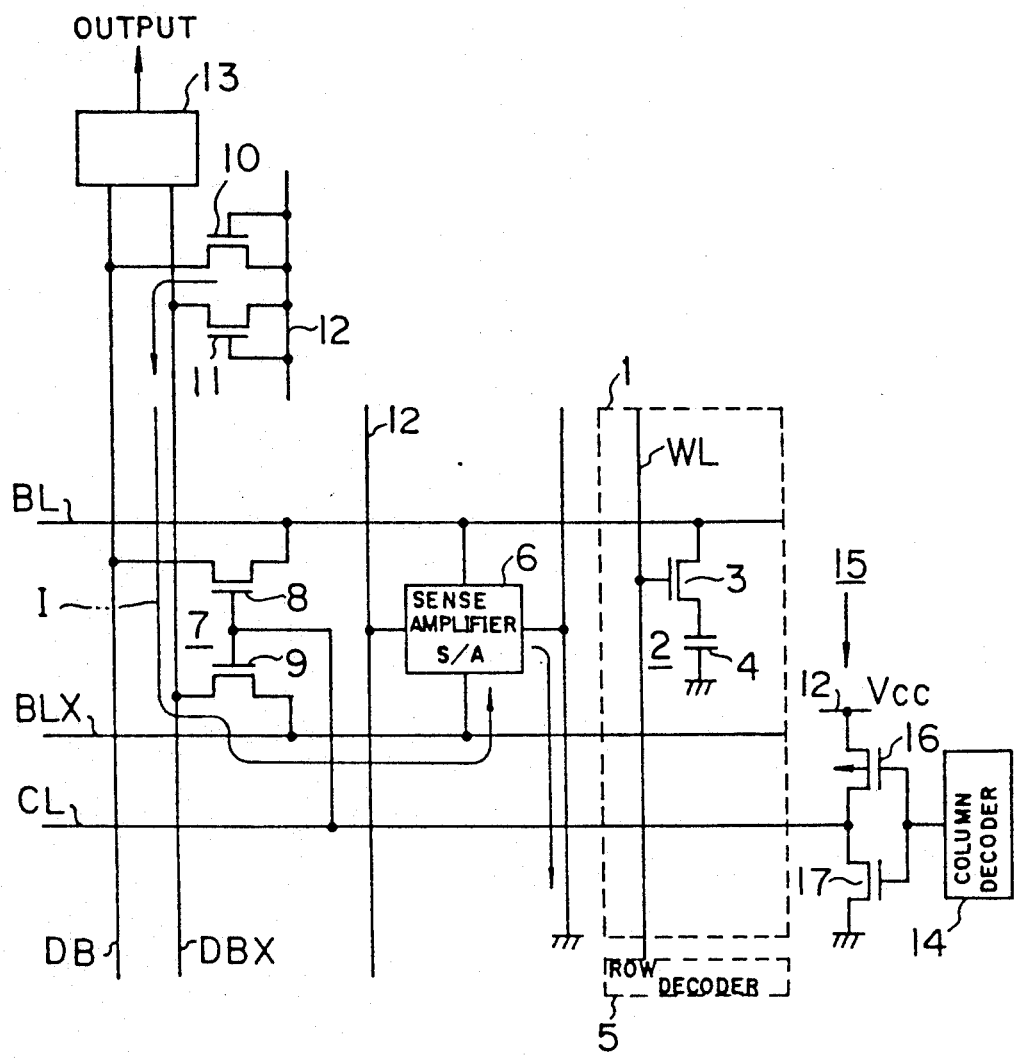
FIG. 1 is a schematic circuit diagram of a conventional semiconductor memory device.
Figure 2:
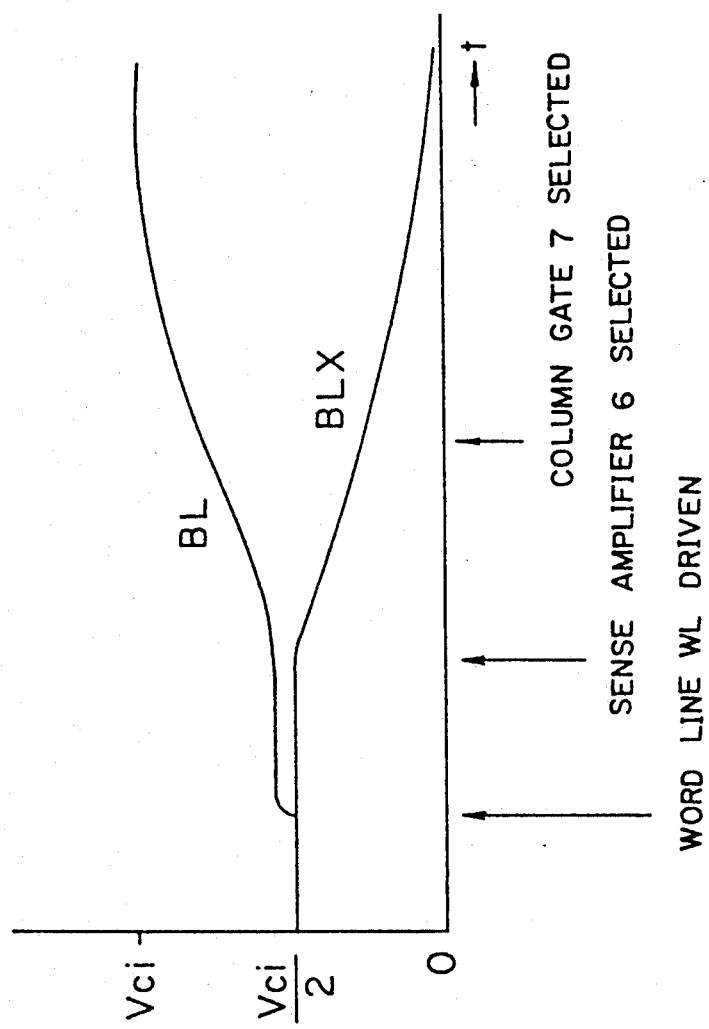
FIG. 2 is a time chart for explaining the operations of the semiconductor memory device shown in FIG. 1.
Figure 3:
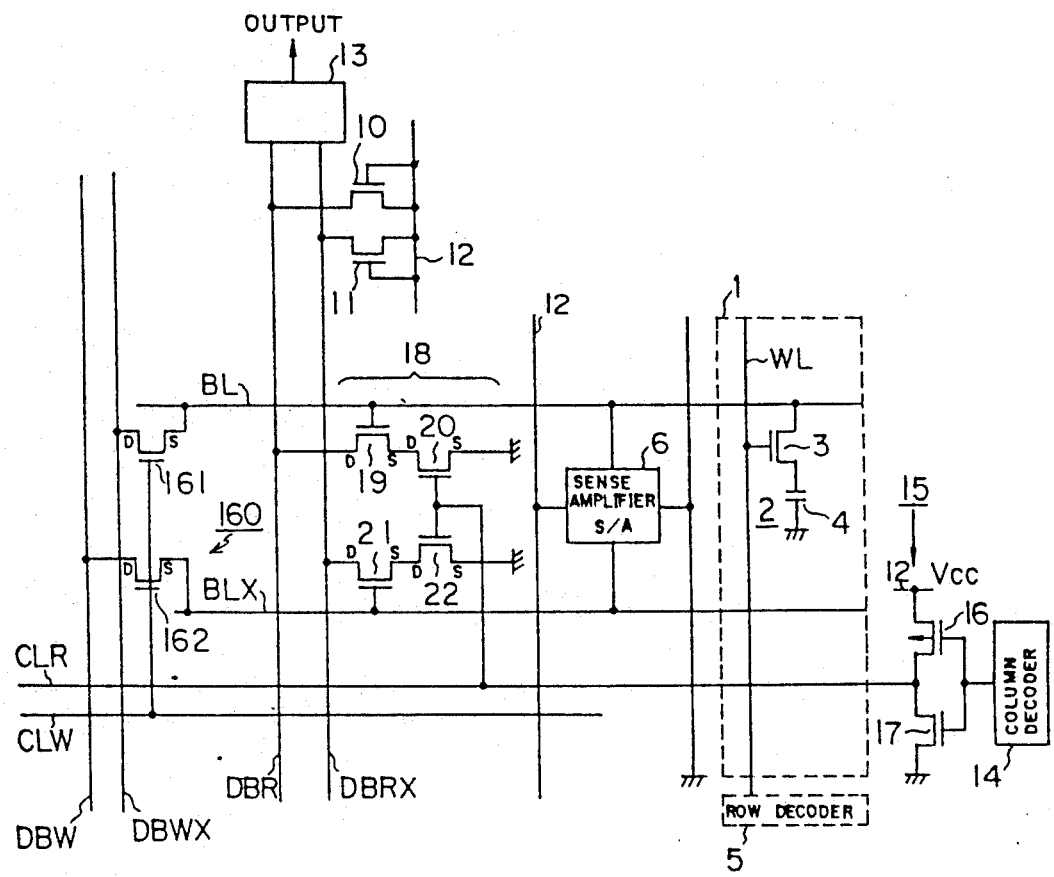
FIG. 3 is a schematic circuit diagram of another conventional semiconductor memory device.

This shows the configuration of a DRAM correcting the above described problem of the conventional DRAMs shown in FIGS. 1 and 3. Parts shown in FIG. 4 which are the same as those shown in FIGS. 1 and 3 have the same numbers.

The datum stored in the memory cell 2 are read out through the bit lines BL and BLX, the sense amplifier (S/A) 6, a readout column gate 23, the data buses DB and DBX, and the data bus amplifier 13.

The DRAM shown in FIG. 4 has the readout column gate 23 in lieu of the readout column gate 18 for the DRAM shown in FIG. 3. The readout column gate 23 comprises two [2] nMOS transistors 24 and 25. A column decoder 45 and a column driver 46 shown in FIG. 4 correspond respectively to the column decoder and the column driver 15 shown in FIGS. 1 and 3.

nMOS transistor 24 has connections with bit line BL at its gate (controlling electrode), and with data bus DB at its drain D (one of its controlled electrodes), and with a readout column selection line CLR at its source S (the other of its controlled electrodes). nMOS transistor 25 has connections with bit line BLX at its gate, with data bus DBX at its drain D, and with the same readout column selection line CLR at its source S (the other of its controlled electrodes).

The readout column selection line CLR is also connected to an output terminal of an inverter 48 in a column driver 46.

A CMOS inverter 49 comprises a pMOS transistor 50 and an nMOS transistor 51 serially connected between the Vcc power supply 12 and the ground. The column driver 46 comprises the CMOS inverter 49 and the inverter 48. The inverter 48 receives an output from the column decoder 45.

The readout column selection line CLR in this example is applied with either Vcc [V] or Vci [=(Vcc−Vth)/2] [V] at a nonselection and with a voltage lower than the precharged voltage (e.g. Vci/2) of the bit lines BL and BLX, e.g. with 0.0 [V]. Here, Vcc is the power supply voltage, and Vth is the threshold voltage of an nMOS transistor. All the nMOS transistors 3, 10, 11, 17, 24 and 25 are formed simultaneously and therefore have the same threshold voltage Vth.

In this example, when the high voltage (i.e. the "1" level) is stored in the memory cell 2, on selection of the memory cell 2, the sense amplifier 6 sets an H level operating voltage and an L level operating voltage respectively to the bit lines BL and BLX. This turns nMOS transistor ON (conductive) and nMOS transistor OFF (nonconductive).

As a result, the current I flows from the Vcc power supply 12 to ground through data bus DB, nMOS transistor 24 and the readout column selection line CLR. In this case, because nMOS transistor 25 turns OFF, no current flows in data bus DBX connected to the drain D of nMOS transistor 25. In this case, no current or little, if any, current flows through data bus DBX. While the voltage difference between bit line BLX and the readout column selection line CLR is temporarily greater than the threshold voltage of nMOS transistor 25, a current flows in data bus DBX. However, the duration of the current flowing in data bus DBX is very short due to the immediate voltage fall of bit line BLX to 0.0 [V]. Therefore, the datum stored in the memory cell 2 is read by detecting the voltages or the currents of the data buses DB and DBX.

This invention does not configure a direct connection between bit line BL and data bus DB or between bit line BLX and data bus DBX. As a result, when the readout column gate 23 is turned ON, the capacitance of bit line BL for the memory cell 2 is equal only to the parasitic capacitance of bit line BL, and the parasitic capacitance of data bus DB has no contribution to the memory cell 2. Therefore, an output signal from the memory cell 2 does not dampen.

Also, because the data buses DB and DBX do not connect to the readout column gate 23 through the sense amplifier 6, no matter what voltages the data buses DB and DBX carry before selecting the readout column gate 23, they have no effects on the sense amplifier 6.

As a result, the time difference between the timing for driving the sense amplifier 6 and that for selecting the readout column gate 23 can be more liberally set. This in turn expedites a selection of the readout column gate 23 after driving the sense amplifier 6, thereby enabling a fast DRAM access.

Besides, the sense amplifier 6 need only drive the bit lines BL and BLX and need not drive data buses DB and DBX. Thus, the bit lines BL and BLX can rise and fall more rapidly, which is also instrumental in expediting the DRAM access.

Moreover, because the readout column gate 23 comprises only two nMOS transistors 24 and 25, this enables a larger-scale integration without incurring an increase in the size of a chip area.

Depiction of the Concrete Embodiments

Figure 5:
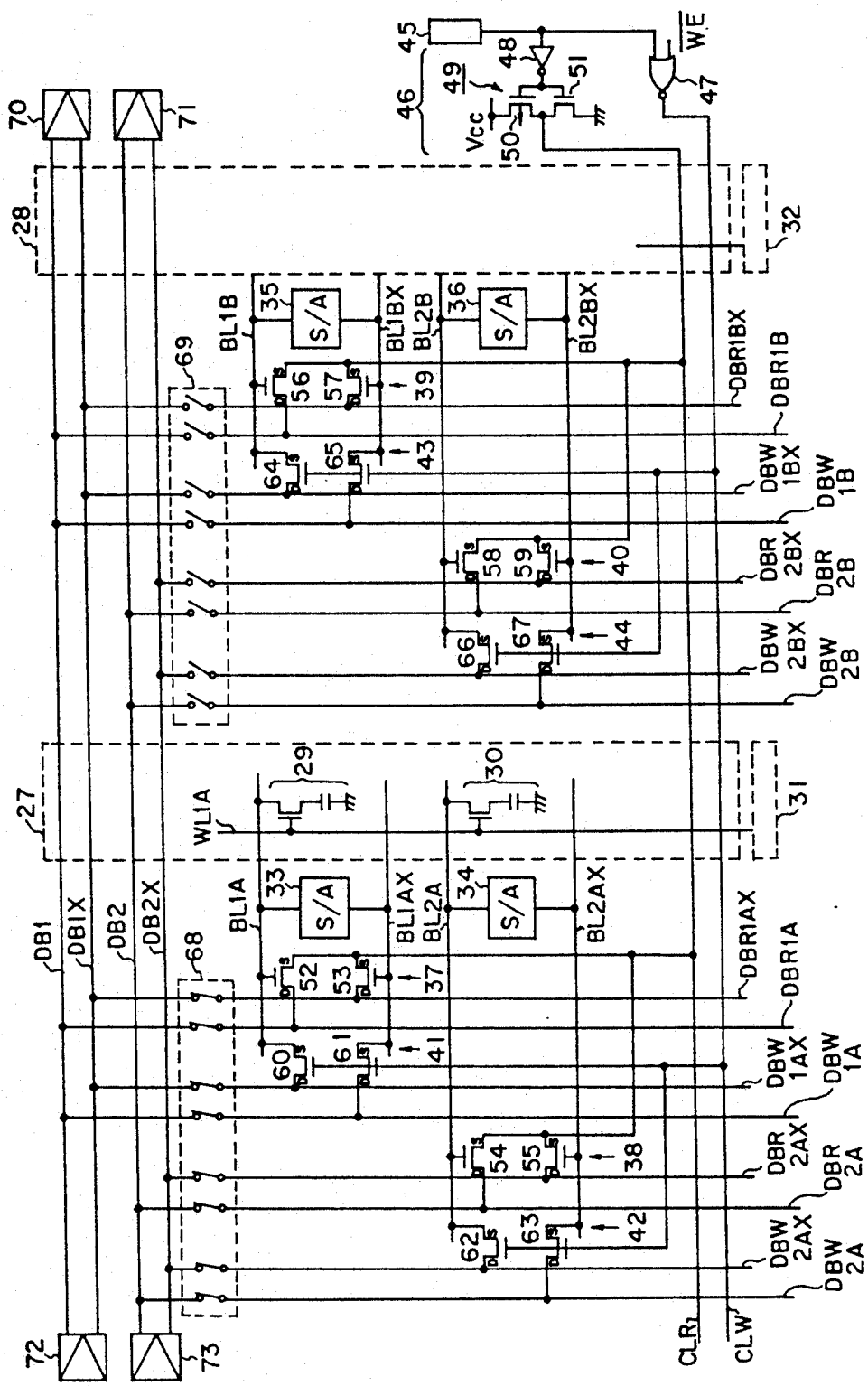
FIG. 5 is a detailed circuit diagram of a first embodiment of this invention.

FIG. 5 is a detailed circuit diagram of a first embodiment of this invention.

Parts shown in FIG. 5 which are the same as those shown in FIG. 4 have the same numbers, and their re-explanations are omitted.

It shows an example of applying this invention to a DRAM of a multiple bit line system capable of multiply selecting memory cells, suitable for use in parallel processing because of its advantage of increased bit number and capacity.

Memory cell arrays 27 and 28 have exactly the same configuration and each comprise at least memory cells 29 and 30 and a word line WL1A. 31 and 32 are row decoders. BL1A, BL1AX, BL2A and BL2AX as well as BL1B, BL1BX, BL2B and BL2BX are bit lines. 33, 34, 35 and 36 are sense amplifiers. 37, 38, 39 and 40 are readout column gates. DBR1A, DBR1AX, DBR2A and DBR2AX are intraarray readout data buses provided commonly for the columns of memory cell array 27. DBR1B, DBR1BX, DBR2B and DBR2BX are intraarray readout data buses provided commonly for the columns of memory cell array 28.

The memory cell arrays 27 and 28 each have a plurality of memory cells not specifically drawn in FIG. 5 in addition to their own memory cells 29 and 30. The memory cell arrays 29 and 30 respectively arrange their pluralities of memory cells in a matrix form.

41, 42, 43 and 44 are write-in column gates. DBW1A, DBW1AX, DBW2A and DBW2AX are intraarray write-in data buses provided commonly for the columns of memory cell array 27. DBW1B, DBW1BX, DBW2B and DBW2BX are intraarray write-in data buses provided commonly for the columns of memory cell array 28. CLR is a readout column selection line. CLW is a write-in column selection line. A NOR circuit 47 forms a write-in column driver activated by a write-enable signal $\overline{WE}$.

Readout column gate 37 comprises two [2] nMOS transistors 52 and 53. nMOS transistor 52 has connections with bit line BL1A at its gate, with intraarray readout data bus DBR1A at its drain D, and with the readout column selection line CLR at its source S. nMOS transistor 53 has connections with bit line BL1AX at its gate, with intraarray readout data bus DBR1AX at its drain D, and with the readout column selection line CLR at its source S.

Readout column gate 38 comprises two [2] nMOS transistors 54 and 55. nMOS transistor 54 has connections with bit line BL2A at its gate, with intraarray readout data bus DBR2A at its drain D, and with the readout column selection line CLR at its source S. nMOS transistor 55 has connections with bit line BL2AX at its gate, with intraarray readout data bus DBR2AX at its drain D, and with the readout column selection line CLR at its source S.

Readout column gate 39 comprises two [2] nMOS transistors 56 and 57. nMOS transistor 56 has connections with bit line BL1B at its gate, with intraarray readout data bus DBR1B at its drain D, and with the readout column selection line CLR at its source S. nMOS transistor 57 has connections with bit line BL1BX at its gate, with intraarray readout data bus DBR1BX at its drain D, and with the readout column selection line CLR at its source S.

Readout column gate 40 comprises two [2] nMOS transistors 58 and 59. nMOS transistor 58 has connections with bit line BL2B at its gate, with intraarray readout data bus DBR2B at its drain D, and with the readout column selection line CLR at its source S. nMOS transistor 59 has connections with bit line BL2BX at its gate, with intraarray readout data bus DBR2BX at its drain D, and with the readout column selection line CLR at its source S.

Write-in column gate 41 comprises two [2] nMOS transistors 60 and 61. nMOS transistor 60 has connections with bit line BL1A at its source S, with intraarray write-in data bus DBW1AX at its drain D, and with the write-in column selection line CLW at its gate. nMOS transistor 61 has connections with bit line BL1AX at its source S, with intraarray write-in data bus DBW1A at its drain D, and with the write-in column selection line CLW at its gate.

Write-in column gate 42 comprises two [2] nMOS transistors 62 and 63. nMOS transistor 62 has connections with bit line BL2A at its source S, with intraarray write-in data bus DBW2AX at its drain D, and with the write-in column selection line CLW at its gate. nMOS transistor 63 has connections with bit line BL2AX at its source S, with intraarray write-in data bus DBW2A at its drain D, and with the write-in column selection line CLW at its gate.

Write-in column gate 43 comprises two [2] nMOS transistors 64 and 65. nMOS transistor 64 has connections with bit line BL1B at its source S, with intraarray write-in data bus DBW1BX at its drain D, and with the write-in column selection line CLW at its gate. nMOS transistor 65 has connections with bit line BL1BX at its source S, with intraarray write-in data bus DBW1B at its drain D, and with the write-in column selection line CLW at its gate.

Write-in column gate 44 comprises two (2) nMOS transistors 66 and 67. nMOS transistor 66 has connections with bit line BL2B at its source S, with intraarray write-in data bus DBW2BX at its drain D, and with the write-in column selection line CLW at its gate. nMOS transistor 67 has connections with bit line BL2BX at its source S, with intraarray write-in data bus DBW2B at its drain D, and with the write-in column selection line CLW at its gate.

The output terminal of the CMOS inverter 49 of the colimn driver 46 connects to the readout column selection line CLR. The inverter 48 of the column driver 46 receives an output from the column decoder 45.

Although this is not specifically drawn in FIG. 5, the bit lines BL1A, BL1AX, BL2A and BL2AX as well as BL1B, BL1BX, BL2B and BL2BX are connected to a precharging circuit to be precharged at Vci/2 [V].

Array common data buses DB1 and DB1X provided commonly for all the columns of memory cell array 27 connect to a data bus amplifier 70 and a write-in amplifier 72. Array common data buses DB2 and DB2X provided commonly for all the columns of memory cell array 28 connect to a data bus amplifier 71 and a write-in amplifier 73.

A block selection switch 68 comprising eight [8] switching elements (e.g. transistors such as nMOS transistors) selects memory cell array 27 when it is turned ON (conductive). More specifically, of the eight [8] switching elements, two [2] toggle ON (become conductive) to connect array common data bus DB2 to intraarray write-in data bus DBW2A and intraarray readout data bus DBR2A, another two [2] toggle ON (become conductive) to connect array common data bus DB2X to intraarray write-in data bus DBW2AX and intraarray readout data bus DBR2AX, yet another two [2] toggle ON (become conductive) to connect array common data bus DB1 to intraarray write-in data bus DBW1A and intraarray readout data bus DBR1A, and the remaining two [2] toggle ON (become conductive) to connect array common data bus DB1X to intraarray write-in data bus DBW1AX and intraarray readout data bus DBR1AX.

A block selection switch 69 comprising eight [8] switching elements (e.g. transistors such as nMOS transistors) selects memory cell array 28 when it is turned ON (conductive). More specifically, of the eight [8] switching elements, two [2] toggle ON (become conductive) to connect array common data bus DB2 to intraarray write-in data bus DBW2B and intraarray readout data bus DBR2B, another two [2] toggle ON (become conductive) to connect array common data bus DB2X to intraarray write-in data bus DBW2BX and intraarray readout data bus DBR2BX, yet another two [2] toggle ON (become conductive) to connect array common data bus DB1 to intraarray write-in data bus DBW1B and intraarray readout data bus DBR1B, and the remaining two [2] toggle ON (become conductive) to connect array common data bus DB1X to intraarray write-in data bus DBW1BX and intraarray readout data bus DBR1BX.

FIG. 5 shows a case in which block selection switch 68 toggles ON to select memory cell array 27.

Figure 6:
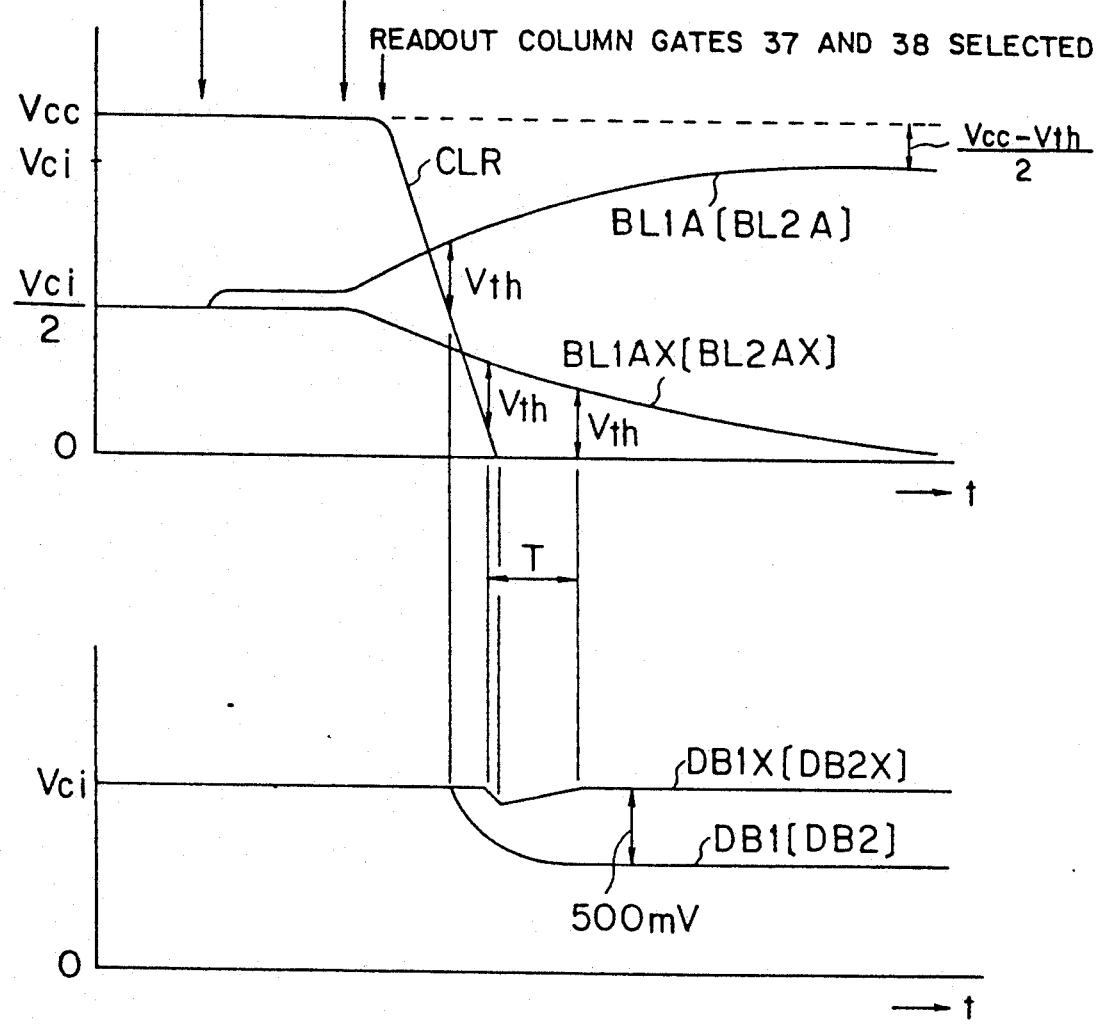
FIG. 6 is a time chart for explaining the operations of the semiconductor memory device shown in FIG. 5.

FIG. 6 is a time chart for explaining the operations of the semiconductor memory device shown in FIG. 5.

The operation of the first embodiment of this invention configured as shown in FIG. 5 is explained next by referring to FIG. 6.

More specifically, FIG. 6 shows a case of reading out data stored in the memory cells 29, 30, . . . . . In this case, word line WL1A is driven first. Because a high voltage (i.e. a "1" level) is stored in the memory cells 29, 30, . . . ., the voltages of bit lines BL1A and BL2A rise fractionally from the precharged Vci/2 [V]. At this time, the voltages of bit lines BL1AX and BL2AX remain unchanged.

Next, the sense amplifiers 33 and 34 are driven. As a result, the voltages of bit lines BL1A and BL2A rise from the precharged Vci/2 [V] to Vci [V], whereas those of bit lines BL1AX and BL2AX fall from the precharged Vci/2 [V] to 0.0 [V].

Then, the column decoder 45 outputs a low level, and the CMOS inverter 49 turns its pMOS transistor 50 ON and its nMOS transistor 51 OFF. The readout column selection line CLR is earthed to perform a column selection. As a result, the voltage of the readout column selection line CLR falls from the power supply voltage Vcc [V] to 0.0 [V].

Then, when the voltage difference between bit line BL1A and the readout column selection line CLR reaches the threshold voltage Vth of an nMOS transistor, nMOS transistor 52 turns ON, thereby allowing a current to flow from array common data bus DB1 through nMOS transistor 52, the readout column selection line CLR and nMOS transistor 51 to the ground. As a result, the voltage of array common data bus DB1 falls from Vci [V] by about 0.5 [V].

Also, when the voltage difference between bit line BL1A and the readout column selection line CLR reaches the threshold voltage Vth of all the nMOS transistors 51 through 67 shown in FIG. 5, nMOS transistor 52 turns ON, thereby allowing a current to flow from array common data bus DB2 through nMOS transistor 54, the readout column selection line CLR and nMOS transistor 51 to the ground. As a result, the voltage of array common data bus DB2 falls from Vci [V] by about 0.5 [V].

The voltage of array common data bus DB1X falls below Vci [V] for a period T in which the voltage difference between bit line BL1AX and the readout column selection line CLR temporarily rises above the threshold voltage Vth of an nMOS transistor, because nMOS transistor 53 turns ON to allow a fractional current to flow from array common data bus DB1X through nMOS transistor 53 and the readout column selection line CLR and nMOS transistor 51 to the ground. Because nMOS transistor 53 returns OFF after the period T has elapsed, the voltage of array common data bus DB1X stabilizes at Vci [V].

Similarly, the voltage of array common data bus DB2X falls below Vci [V] during the period T in which the voltage difference between bit line BL2AX and the readout column selection line CLR temporarily rises above the threshold voltage Vth of an nMOS transistor, because nMOS transistor 55 turns ON to allow a fractional current to flow from array common data bus DB2X through nMOS transistor 55 and the readout column selection line CLR and nMOS transistor 51 to the ground. Because nMOS transistor 55 returns OFF after the period T has elapsed, the voltage of array common data bus DB2X stabilizes at Vci [V].

Data bus amplifier 70 detects the voltages of array common data buses DB1 and DB1X, thereby reading the data stored in the memory cells 29, 30, .... of memory cell array 27. Data bus amplifier 71 detects the voltages of array common data buses DB2 and DB2X, thereby reading the data stored in the memory cells 29, 30, .... of memory cell array 28.

When data are written into the memory cells 29, 30, ...., the write-in column selection line CLW is charged at the power supply voltage Vcc [V], thereby turning write-in column gates 41 and 42 ON. In the first embodiment, when the data stored in the memory cells 29, 30, .... are read, by turning write-in column gates 41 and 42 ON, the data can be rewritten into the memory cells 29, 30, .....

In the first embodiment, when the datum stored in memory cell 29 is read, for instance, neither can bit line BL1A connect directly with intraarray readout data bus DBR1A nor can bit line BL1AX connect directly with intraarray readout data bus DBR1AX.

As a result, when readout column gate 37 turns ON, the capacitance of bit line BL1A for memory cell 29 is equal only to the parasitic capacitance of bit line BL1A, and the parasitic capacitance of intraarray readout data bus DBR1A has no contribution to the capacitance of bit line BL1A for memory cell 29. This prevents an output signal from memory cell 29 from being dampened. No matter what voltages intraarray readout data buses DBR1A and DBR1AX carry before selecting readout column gate 37, they have no effects on the sense amplifier 6. This is universally true for all other memory cells.

As a result, the time difference between the timing for driving the sense amplifier 33 and that for selecting readout column gate 37 can be more liberally set. This in turn expedites a selection of the readout column gate 18 after driving the sense amplifier 6, thereby realizing a fast DRAM access.

Besides, the sense amplifier 33 need only drive bit lines BL1A and BL1AX and need not drive intraarray readout data buses DBR1A and DBR1AX. Thus, bit lines BL1A and BL1AX can rise and fall more rapidly, which is also instrumental in expediting the access.

Moreover, because the readout column gates 37, 38, 39 and 40 and the write-in column gates 41, 42, 43 and 44 each comprise only two [2] nMOS transistors, the first embodiment shown in FIG. 5 has a faster DRAM access than a conventional DRAM such as one shown in FIG. 3.

Figure 7:
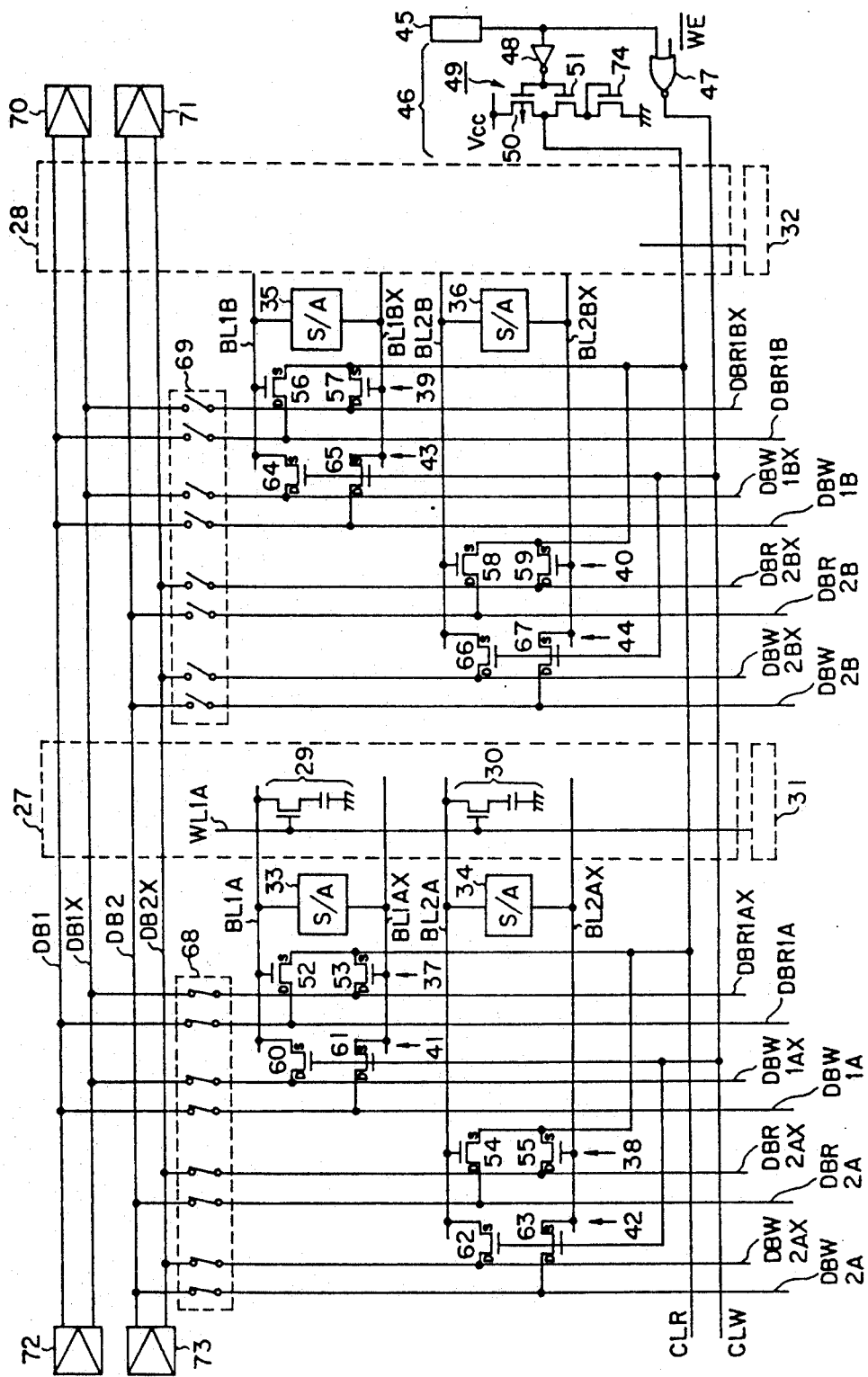
FIG. 7 is a detailed circuit diagram of a second embodiment of this invention.

FIG. 7 is a detailed circuit diagram of a second embodiment of this invention.

The second embodiment presents a further improvement over the improvement made by the first embodiment, which is described below by referring to FIG. 8.

Figure 8A:
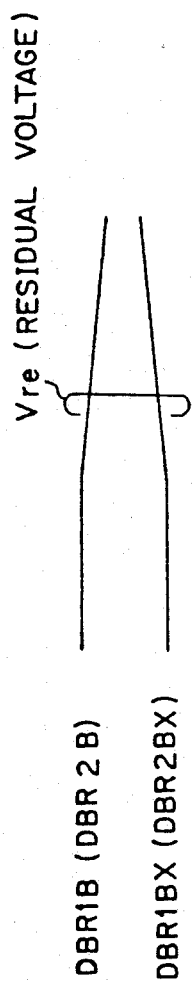
FIGS. 8A-8C illustrate improvements in the second embodiment over the first embodiment.
Figure 8B:
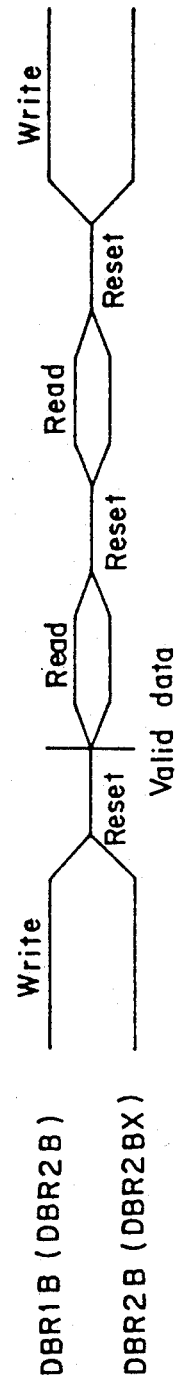
Figure 8C:
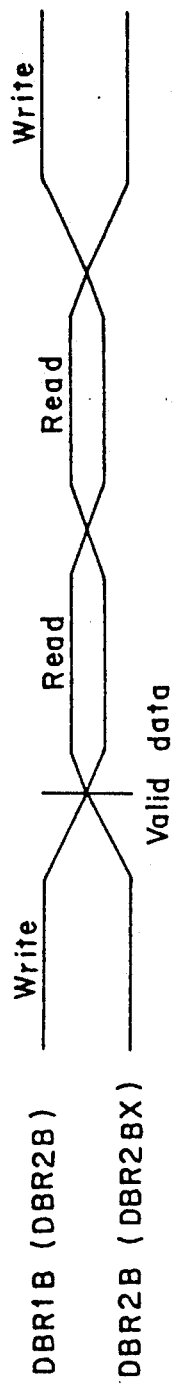

FIG. 8 illustrates improvements in the second embodiment over the first embodiment.

As described above, the first embodiment configures to set 0.0 [V] to the readout column selection line CLR at a readout time. This produces the following problem. Assume, for instance, the power supply voltage Vcc is 3.0 [V], the precharged voltage of all the bit lines BL1A through BL2BX is 1.2 [V], the threshold voltage Vth of all the nMOS transistors 51 through 67 and 74 shown in FIG. 7 is 0.6 [V]. If memory cell array 27 is selected and memory cell array 28 is not selected, because the voltage differences between the respective gates and respective sources of nMOS transistors 56, 57, 58 and 59 become 1.2 [V], which is higher than the threshold voltage Vth (=0.6 [V]) of an nMOS transistor, nMOS transistors 56, 57, 58 and 59 are turned ON, thereby allowing a current to flow from intraarray readout data buses DBR1B, DBR1BX, DBR2B and DBR2BX to the earthed readout column selection line CLR.

As shown in part (a) of FIG. 8, if memory cell array 27 is selected thereafter, the voltages of intraarray readout data buses DBR1B, DBR1BX, DBR2B and DBR2BX need to be reset, such that a residual voltage Vre of intraarray readout data buses DBR1B, DBR1BX, DBR2B and DBR2BX does not cause any malfunctioning in reading out data. The time required for voltage resetting entails a problem of slower DRAM access.

That is, as shown in part (b) of FIG. 8, the first embodiment of this invention necessitates an access be made to memory cell array 27 always by resetting intraarray readout data buses DBR1B, DBR1BX, DBR2B and DBR2BX, after data are written in or read out from the memory cells 29, 30, . . . . .

The second embodiment shown in FIG. 7 corrects the above described disadvantages of the first embodiment of this invention. It has a configuration similar to that of the second embodiment except that it configures the source of nMOS transistor 51 forming the CMOS inverter 49 of the column driver 46 to be earthed through an nMOS transistor 74 connected to a diode, instead of directly as in the first embodiment. Parts shown in FIG. 7 which are the same as those shown in FIG. 6 have the same numbers.

In the second embodiment, a provision of nMOS transistor 74 connected to the diode sets the voltage of the readout selection line CLR to 0.6 [V], when the column decoder 45 invokes column driver 46 for a column selection. This arrangement maintains the voltage difference respectively between gates and sources of nMOS transistors 56, 57, 58 and 59 to be 0.6 [V], thereby ensuring nMOS transistors 56, 57, 58 and 59 are not turned ON, even if memory cell array 27 is selected while memory cell array 28 is not selected. Consequently, no current flows from intraarray readout data buses DBR1B, DBR1BX, DBR2B and DBR2BX to the readout column selection line CLR. This eliminates the necessity to reset the voltages of intraarray readout data buses DBR1B, DBR1BX, DBR2B and DBR2BX, even if memory cell array 28 is selected thereafter. Since the second embodiment shown in FIG. 7 saves the time required to reset those voltages, it has a DRAM access faster by this time period than the first embodiment shown in FIG. 5.

Also, because this configuration reduces the current flowing in the readout column selection line CLR, it can also reduce the line width of the readout column selection line CLR, thereby enabling the miniaturization of the DRAM through its larger-scale integration.

Figure 9:
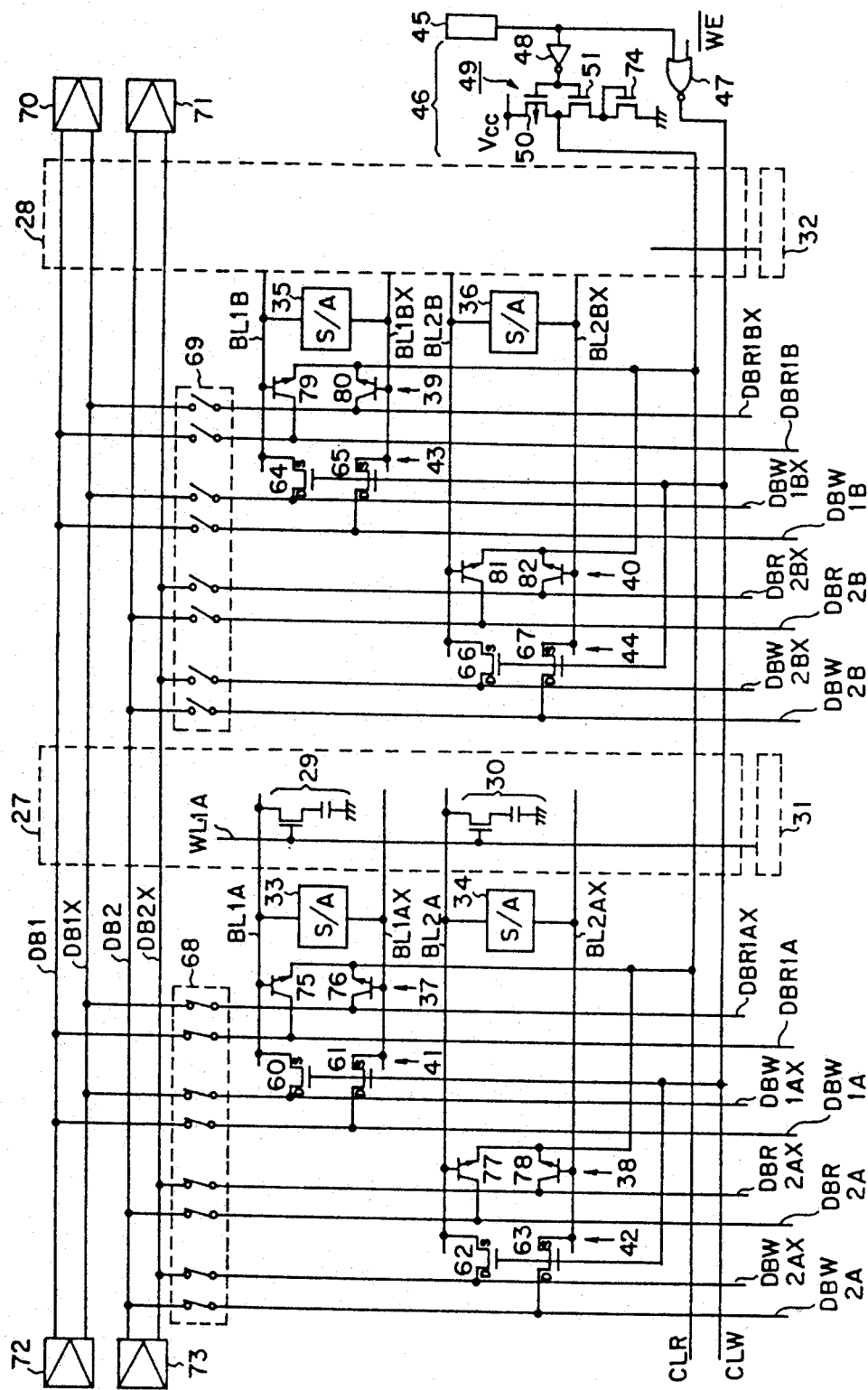
FIG. 9 is a detaled circuit diagram of a third embodiment of this invention.

FIG. 9 is a detailed circuit diagram of a third embodiment of this invention.

The third embodiment presents a further improvement over the improvement made by the second embodiment.

It has a configuration similar to that of the second embodiment except that it configures the readout column gates 37, 38, 39 and 40 to each comprise two [2] of eight [8] NPN bipolar transistors 75 through 82, instead of two [2] of eight [8] nMOS transistors 52 through 59 as in the second embodiment. Parts shown in FIG. 7 which are the same as those shown in FIG. 6 have the same numbers.

Column gate 37 shown in FIG. 9 comprises two [2] NPN bipolar transistors 75 and 76 in lieu of two [2] nMOS transistors 52 and 53. NPN bipolar transistor 75 has connections with bit line BL1A at its base, with intraarray readout data bus DBR1A at its collector, and with the readout column selection line CLR at its emitter. NPN bipolar transistor 76 has connections with bit line BL1AX at its base, with intraarray readout data bus DBR1AX at its collector, and with the readout column selection line CLR at its emitter.

Column gate 38 shown in FIG. 9 comprises two [2] NPN bipolar transistors 77 and 78 in lieu of two [2] nMOS transistors 54 and 55. NPN bipolar transistor 77 has connections with bit line BL2A at its base, with intraarray readout data bus DBR2A at its collector, and with the readout column selection line CLR at its emitter. NPN bipolar transistor 78 has connections with bit line BL2AX at its base, with intraarray readout data bus DBR2AX at its collector, and with the readout column selection line CLR at its emitter.

Column gate 39 shown in FIG. 9 comprises two [2] NPN bipolar transistors 79 and 80 in lieu of two [2] nMOS transistors 56 and 57. NPN bipolar transistor 79 has connections with bit line BL1B at its base, with intraarray readout data bus DBR1B at its collector, and with the readout column selection line CLR at its emitter. NPN bipolar transistor 80 has connections with bit line BL1BX at its base, with intraarray readout data bus DBR1BX at its collector, and with the readout column selection line CLR at its emitter.

Column gate 40 shown in FIG. 9 comprises two [2] NPN bipolar transistors 81 and 82 in lieu of two [2] nMOS transistors 58 and 59. NPN bipolar transistor 81 has connections with bit line BL2B at its base, with intraarray readout data bus DBR2B at its collector, and with the readout column selection line CLR at its emitter. NPN bipolar transistor 82 has connections with bit line BL2BX at its base, with intraarray readout data bus DBR2BX at its collector, and with the readout column selection line CLR at its emitter.

Thus, because the third embodiment of this invention configures the four [4] readout column gates 37, 38, 39 and 40 shown in FIG. 9 to comprise eight [8] NPN bipolar transistors 75 through 82 instead of nMOS transistors 52 through 59 as in the second embodiment shown in FIG. 7, the readout column gates 37, 38, 39 and 40 have higher switching speeds, which is effective in realizing a faster DRAM access than that in the second embodiment.

Although the column driver 46 in the first, second or third embodiment of this invention comprises the inverter 48 and the CMOS inverter 49 connected serially, it may comprise only the CMOS inverter 49.

It is also possible to replace eight [8] nMOS transistors 52 through 59 of the four [4] readout column gates 37, 38, 39 and 40 for use in the first embodiment shown in FIG. 5 with eight [8] NPN bipolar transistors 75 through 82.

In the first, second or third embodiment of this invention, the gates (controlling electrodes) of nMOS transistors 52 through 59 of the readout column gates 37, 38, 39 and 40 are made e.g. of polysilicon, and the drains and sources of the same are made e.g. of n type diffusion regions into which high doses of As (arsenic) are ion-injected.

In addition, the eight [8] bit lines BL1A through BL2BX, connected to the gates of eight [8] nMOS transistors 52 through 59 are made e.g. of Al (aluminum) or polycide wiring with a small film thickness and an excellent minute workability.

Additionally, the eight [8] intraarray readout data buses DBR1A through DBR2BX connected to the drains of eight [8] nMOS transistors 52 through 59, as well as the readout column selection line CLR connected to their sources are made e.g. of Al (aluminum), pure Al-Si, and Al-Si with Cu added. Similarly, the eight [8] intraarray write-in data buses DBW1A through DBW2BX connected to the drains of eight [8] nMOS transistors 60 through 67, as well as the write-in column selection line CLW connected to their sources are made e.g. of Al (aluminum), pure Al-Si, and Al-Si with Cu added.

Further, the drains and sources of nMOS transistors 52 through 59, as well as their contact holes with the eight [8] intraarray readout data buses DBR1A through DBR2BX are made e.g. of barrier metals such as TiN and TiW and silicide. Also, the drains and sources of nMOS transistors 60 through 67, as well as their contact holes with the eight [8] intraarray write-in data buses DBW1A through DBW2BX are made e.g. of barrier metals such as TiN and TiW and silicide.

Furthermore, in the first, second or third embodiment of this invention, the memory cells 29, 30, . . . . are preferably made of stacked capacitor cells, but may also be made of grooved cells or planar cells. Stacked capacitor cells and grooved cells are suitable for larger-scale integration. Especially, stacked capacitor cells are more resistant to soft errors than other types of cells and therefore more reliable. They also have an advantage of longer refreshing cycles because of small leak currents. Besides, because stacked capacitor cells can easily form relatively large transistors, they have sufficient margins for declining resistance against hot carriers incurred by a miniaturization. Additionally, because stacked capacitor cells can use relatively loose design rules, they can continue to be manufactured by proven conventional processing techniques, thus simplifying their fabrications.

Moreover, in the first, second or third embodiment of this invention, each of the memory cells 29, 30, . . . . is a one-transistor cell comprising a single transistor and a single capacitor. However, this invention is also applicable to a DRAM each of whose memory cells comprises three [3] transistors and one [1] capacitor, and to a DRAM each of whose memory cells comprises four [4] transistors and two [2] capacitors.

Besides, in the first, second or third embodiment of this invention, an alternative case may be considered in which all the transistors are replaced by those having the opposite polarities. That is, the alternative arrangement of an embodiment causes a pMOS transistor to replace the corresponding nMOS transistor, an nMOS transistor to replace the corresponding pMOS transistor, and a PNP bipolar transistor to replace the corresponding NPN bipolar transistor, for all applicable elements. The alternative arrangement configures the column driver circuit, such that the voltage of the readout column selection line is higher instead of lower, than the precharged voltage Vci of the pair of bit lines at a column selection time. It should not, however, be construed that the first, second or third embodiment of this invention limits its transistor alignment only to the original arrangement shown in FIG. 5, 7 or 9, and the alternative arrangement discussed in this paragraph. Other variant plans are conceivable, as well.

Figure 10:
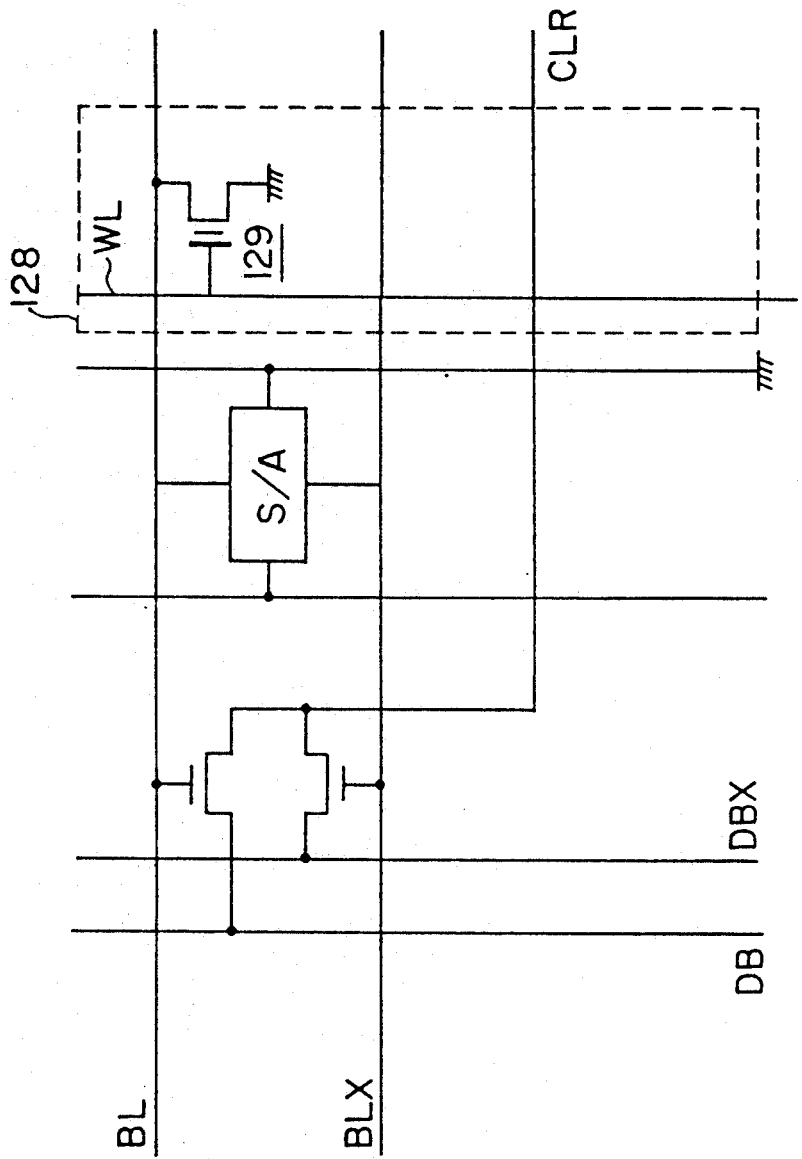
FIG. 10 is a circuit diagram of the pertinent part of a flash EEPROM with this invention applied.

FIG. 10 is a circuit diagram of the pertinent part of a flash EEPROM with this invention applied.

This invention can also be applied to an EEPROM (electrically erasable programmable read only memory), especially of a flash type.

A memory cell array 128 comprises a plurality of EEPROM cells 129 arranged in a matrix form. The EEPROM cells 129 can be structured by any of a stacked type, a split gate type and a three-layer polycrystal silicon type.

Finally, in the first, second or third embodiment of this invention, a case is illustrated in which this invention is applied to a semiconductor memory device comprising a plurality of divided memory cell arrays commonly having the column decoder 45 and the column driver 46. However, this invention can also be applied to a semiconductor memory device comprising a whole memory cell array having only one [1] column decoder and one [1] column driver, and a semiconductor memory device comprising a plurality of divided memory cell arrays each individually having a column decoder and a column driver.

As described above, because this invention makes an arrangement such that a readout column gate does not connect directly to a bit line or a data bus, a readout column gate can be selected at an earlier point in time after a sense amplifier is driven. This enables a faster DRAM access. Plus, because this invention configures a readout column gate with two [2] transistors, a large-scale integration is made possible without an increase in the size of a chip area.

What is claimed is

1. A semiconductor memory device comprising:
    a memory cell array unit formed by a plurality of memory cells arranged in a matrix form, in which the datum stored in a selected memory cell are read out through a pair of bit lines provided at each column of said memory cell array unit, a sense amplifier, a readout column gate, and a pair of data buses provided commonly for columns of said memory cell array unit,
    said readout column gate comprises a first transistor and a second transistor,
    said first transistor has its controlling electrodes connected to one of said pair of bit lines and the other of said pair of bit lines, and its controlled electrodes connected to one of said pair of data buses and said readout column selection line, and
    said second transistor has its controlling electrodes connected to one of said pair of bit lines and the other of said pair of bit lines, and its controlled electrodes connected to the other of said pair of data buses and said readout column selection line;
    a column driver for setting, at a column selection time, the voltage of said readout column selection line to a voltage different than the precharged voltage of said pair of bit lines; and
    a column decoder for decoding a column address signal and for outputting to said column driver a signal indicating whether or not a column is selected.

2. The semiconductor memory device as set forth in claim 1, wherein:
    said memory cell array unit comprises a plurality of memory cell array subunits; and
    said column decoder and said column driver are shared by said plurality of memory cell array subunits.

3. The semiconductor memory device as set forth in claim 1, wherein:
    said memory cell array unit comprises a whole single memory cell array; and
    said column decoder and said column driver are provided solely for said memory cell array unit.

4. The semiconductor memory device as set forth in claim 1, wherein:
    said memory cell array unit comprises a plurality of memory cell array subunits; and
    said column decoder and said column driver are provided for each of said plurality of memory cell array subunits.

5. The semiconductor memory device as set forth in claim 1, wherein:
said first transistor and said second transistor of said readout column gate comprise MOS transistors.

6. The semiconductor memory device as set forth in claim 1, wherein:
said first transistor and said second transistor of said readout column gate comprise bipolar transistors.

7. The semiconductor memory device as set forth in claim 1, wherein:
said column driver comprises a CMOS inverter whose output terminal is connected to said readout column selection line.

8. The semiconductor memory device as set forth in claim 1, wherein:
each of said plurality of memory cells comprises one [1] transistor and one [1] capacitor.

9. The semiconductor memory device as set forth in claim 1, wherein:
each of said plurality of memory cells comprises three [3] transistors and one [1] capacitor.

10. The semiconductor memory device as set forth in claim 1, wherein:
each of said plurality of memory cells comprises four [4] transistors and two [2] capacitors.

11. The semiconductor memory device as set forth in claim 1, wherein:
each of said plurality of memory cells comprises an EEPROM.

12. The semiconductor memory device as set forth in claim 8, wherein:
each of said plurality of memory cells comprises a stacked capacitor cell.

13. The semiconductor memory device as set forth in claim 11, wherein:
said EEPROM is a flash EEPROM.

14. The semiconductor memory device as set forth in claim 2, wherein:
each of said plurality of memory cells comprises one [1] transistor and one [1] capacitor.

15. The semiconductor memory device as set forth in claim 2, wherein:
each of said plurality of memory cells comprises three [3] transistors and one [1] capacitor.

16. The semiconductor memory device as set forth in claim 2, wherein:
each of said plurality of memory cells comprises four [4] transistors and two [2] capacitors.

17. The semiconductor memory device as set forth in claim 2, wherein:
each of said plurality of memory cells comprises an EEPROM.

18. The semiconductor memory device as set forth in claim 14, wherein:
each of said plurality of memory cells comprises a stacked capacitor cell.

19. The semiconductor memory device as set forth in claim 17, wherein:
said EEPROM is a flash EEPROM.

20. The semiconductor memory device as set forth in claim 3, wherein:
each of said plurality of memory cells comprises one [1] transistor and one [1] capacitor.

21. The semiconductor memory device as set forth in claim 3, wherein:
each of said plurality of memory cells comprises three [3] transistors and one [1] capacitor.

22. The semiconductor memory device as set forth in claim 3, wherein:
each of said plurality of memory cells comprises four [4] transistors and two [2] capacitors.

23. The semiconductor memory device as set forth in claim 3, wherein:
each of said plurality of memory cells comprises an EEPROM.

24. The semiconductor memory device as set forth in claim 20, wherein:
each of said plurality of memory cells comprises a stacked capacitor cell.

25. The semiconductor memory device as set forth in claim 23, wherein:
said EEPROM is a flash EEPROM.

26. The semiconductor memory device as set forth in claim 4, wherein:
each of said plurality of memory cells comprises one [1] transistor and one [1] capacitor.

27. The semiconductor memory device as set forth in claim 4, wherein:
each of said plurality of memory cells comprises three [3] transistors and one [1] capacitor.

28. The semiconductor memory device as set forth in claim 4, wherein:
each of said plurality of memory cells comprises four [4] transistors and two [2] capacitors.

29. The semiconductor memory device as set forth in claim 4, wherein:
each of said plurality of memory cells comprises an EEPROM.

30. The semiconductor memory device as set forth in claim 26, wherein:
each of said plurality of memory cells comprises a stacked capacitor cell.

31. The semiconductor memory device as set forth in claim 29, wherein:
said EEPROM is a flash EEPROM.

32. The semiconductor memory device as set forth in claim 5, wherein:
each of said plurality of memory cells comprises one [1] transistor and one [1] capacitor.

33. The semiconductor memory device as set forth in claim 5, wherein:
each of said plurality of memory cells comprises three [3] transistors and one [1] capacitor.

34. The semiconductor memory device as set forth in claim 5, wherein:
each of said plurality of memory cells comprises four [4] transistors and two [2] capacitors.

35. The semiconductor memory device as set forth in claim 5, wherein:
each of said plurality of memory cells comprises an EEPROM.

36. The semiconductor memory device as set forth in claim 32, wherein:
each of said plurality of memory cells comprises a stacked capacitor cell.

37. The semiconductor memory device as set forth in claim 35, wherein:
said EEPROM is a flash EEPROM.

38. The semiconductor memory device as set forth in claim 6, wherein:
each of said plurality of memory cells comprises one [1] transistor and one [1] capacitor.

39. The semiconductor memory device as set forth in claim 6, wherein:

each of said plurality of memory cells comprises three [3] transistors and one [1] capacitor.

40. The semiconductor memory device as set forth in claim 6, wherein:
each of said plurality of memory cells comprises four [4] transistors and two [2] capacitors.

41. The semiconductor memory device as set forth in claim 6, wherein:
each of said plurality of memory cells comprises an EEPROM.

42. The semiconductor memory device as set forth in claim 38, wherein:
each of said plurality of memory cells comprises a stacked capacitor cell.

43. The semiconductor memory device as set forth in claim 41, wherein:
said EEPROM is a flash EEPROM.

44. The semiconductor memory device as set forth in claim 7, wherein:
each of said plurality of memory cells comprises one [1] transistor and one [1] capacitor.

45. The semiconductor memory device as set forth in claim 7, wherein:
each of said plurality of memory cells comprises three [3] transistors and one [1] capacitor.

46. The semiconductor memory device as set forth in claim 7, wherein:
each of said plurality of memory cells comprises four [4] transistors and two [2] capacitors.

47. The semiconductor memory device as set forth in claim 7, wherein:
each of said plurality of memory cells comprises an EEPROM.

48. The semiconductor memory device as set forth in claim 44, wherein:
each of said plurality of memory cells comprises a stacked capacitor cell.

49. The semiconductor memory device as set forth in claim 47, wherein:
said EEPROM is a flash EEPROM.

50. A semiconductor memory device comprising:
a memory cell array unit formed of a plurality of memory cells arranged in a matrix form, in which the datum stored in a selected memory cell are read out through a pair of bit lines provided at each column of said memory cell array unit, a sense amplifier, a readout column gate, and a pair of data buses provided commonly for columns of said memory cell array unit,
said readout column gate comprises a first transistor and a second transistor,
said first transistor has its controlling electrodes connected to one of said pair of bit lines and the other of said pair of bit lines, and its controlled electrodes connected to one of said pair of data buses and said readout column selection line, and
said second transistor has its controlling electrodes connected to one of said pair of bit lines and the other of said pair of bit lines, and its controlled electrodes connected to the other of said pair of data buses and said readout column selection line;
a column driver for setting, at a column selection time, the voltage of said readout column selection line to a voltage, which does not turn on a transistor in an unselected column gate of said memory cell array unit, different than the precharged voltage of said pair of bit lines; and
a column decoder for decoding a column address signal and for outputting to said column driver a signal indicating whether or not a column is selected.

51. The semiconductor memory device as set forth in claim 50, wherein:
said memory cell array unit comprises a plurality of memory cell array subunits; and
said column decoder and said column driver are shared by said plurality of memory cell array subunits.

52. The semiconductor memory device as set forth in claim 50, wherein:
said memory cell array unit comprises a whole single memory cell array; and
said column decoder and said column driver are provided solely for said memory cell array unit.

53. The semiconductor memory device as set forth in claim 50, wherein:
said memory cell array unit comprises a plurality of memory cell array subunits; and
said column decoder and said column driver are provided for each of said plurality of memory cell array subunits.

54. The semiconductor memory device as set forth in claim 50, wherein:
said first transistor and said second transistor of said readout column gate comprise MOS transistors.

55. The semiconductor memory device as set forth in claim 50, wherein:
said first transistor and said second transistor of said readout column gate comprise bipolar transistors.

56. The semiconductor memory device as set forth in claim 50, wherein:
said column driver comprises a CMOS inverter whose output terminal is connected to said readout column selection line; and
said CMOS inverter is earthed through a diode-connected MOS transistor.

57. The semiconductor memory device as set forth in claim 50, wherein:
each of said plurality of memory cells comprises one [1] transistor and one [1] capacitor.

58. The semiconductor memory device as set forth in claim 50, wherein:
each of said plurality of memory cells comprises three [3] transistors and one [1] capacitor.

59. The semiconductor memory device as set forth in claim 50, wherein:
each of said plurality of memory cells comprises four [4] transistors and two [2] capacitors.

60. The semiconductor memory device as set forth in claim 50, wherein:
each of said plurality of memory cells comprises an EEPROM.

61. The semiconductor memory device as set forth in claim 57, wherein:
each of said plurality of memory cells comprises a stacked capacitor cell.

62. The semiconductor memory device as set forth in claim 60, wherein:
said EEPROM is a flash EEPROM.

63. The semiconductor memory device as set forth in claim 51, wherein:
each of said plurality of memory cells comprises one [1] transistor and one [1] capacitor.

64. The semiconductor memory device as set forth in claim 51, wherein:

each of said plurality of memory cells comprises three [3] transistors and one [1] capacitor.

65. The semiconductor memory device as set forth in claim 51, wherein:
each of said plurality of memory cells comprises four [4] transistors and two [2] capacitors.

66. The semiconductor memory device as set forth in claim 51, wherein:
each of said plurality of memory cells comprises an EEPROM.

67. The semiconductor memory device as set forth in claim 63, wherein:
each of said plurality of memory cells comprises a stacked capacitor cell.

68. The semiconductor memory device as set forth in claim 66, wherein:
said EEPROM is a flash EEPROM.

69. The semiconductor memory device as set forth in claim 52, wherein:
each of said plurality of memory cells comprises one [1] transistor and one [1] capacitor.

70. The semiconductor memory device as set forth in claim 52, wherein:
each of said plurality of memory cells comprises three [3] transistors and one [1] capacitor.

71. The semiconductor memory device as set forth in claim 52, wherein:
each of said plurality of memory cells comprises four [4] transistors and two [2] capacitors.

72. The semiconductor memory device as set forth in claim 52, wherein:
each of said plurality of memory cells comprises an EEPROM.

73. The semiconductor memory device as set forth in claim 69, wherein:
each of said plurality of memory cells comprises a stacked capacitor cell.

74. The semiconductor memory device as set forth in claim 72, wherein:
said EEPROM is a flash EEPROM.

75. The semiconductor memory device as set forth in claim 53, wherein:
each of said plurality of memory cells comprises one [1] transistor and one [1] capacitor.

76. The semiconductor memory device as set forth in claim 53, wherein:
each of said plurality of memory cells comprises three [3] transistors and one [1] capacitor.

77. The semiconductor memory device as set forth in claim 53, wherein: each of said plurality of memory cells comprises four [4] transistors and two [2] capacitors.

78. The semiconductor memory device as set forth in claim 53, wherein:
each of said plurality of memory cells comprises an EEPROM.

79. The semiconductor memory device as set forth in claim 75, wherein:
each of said plurality of memory cells comprises a stacked capacitor cell.

80. The semiconductor memory device as set forth in claim 78, wherein:
said EEPROM is a flash EEPROM.

81. The semiconductor memory device as set forth in claim 54, wherein:
each of said plurality of memory cells comprises one [1] transistor and one [1] capacitor.

82. The semiconductor memory device as set forth in claim 54, wherein:
each of said plurality of memory cells comprises three [3] transistors and one [1] capacitor.

83. The semiconductor memory device as set forth in claim 54, wherein:
each of said plurality of memory cells comprises four [4] transistors and two [2] capacitors.

84. The semiconductor memory device as set forth in claim 54, wherein:
each of said plurality of memory cells comprises an EEPROM.

85. The semiconductor memory device as set forth in claim 81, wherein:
each of said plurality of memory cells comprises a stacked capacitor cell.

86. The semiconductor memory device as set forth in claim 84, wherein:
said EEPROM is a flash EEPROM.

87. The semiconductor memory device as set forth in claim 55, wherein:
each of said plurality of memory cells comprises one [1] transistor and one [1] capacitor.

88. The semiconductor memory device as set forth in claim 55, wherein:
each of said plurality of memory cells comprises three [3] transistors and one [1] capacitor.

89. The semiconductor memory device as set forth in claim 55, wherein:
each of said plurality of memory cells comprises four [4] transistors and two [2] capacitors.

90. The semiconductor memory device as set forth in claim 55, wherein:
each of said plurality of memory cells comprises an EEPROM.

91. The semiconductor memory device as set forth in claim 87, wherein:
each of said plurality of memory cells comprises a stacked capacitor cell.

92. The semiconductor memory device as set forth in claim 90, wherein:
said EEPROM is a flash EEPROM.

93. The semiconductor memory device as set forth in claim 56, wherein:
each of said plurality of memory cells comprises one [1] transistor and one [1] capacitor.

94. The semiconductor memory device as set forth in claim 56, wherein:
each of said plurality of memory cells comprises three [3] transistors and one [1] capacitor.

95. The semiconductor memory device as set forth in claim 56, wherein:
each of said plurality of memory cells comprises four [4] transistors and two [2] capacitors.

96. The semiconductor memory device as set forth in claim 56, wherein:
each of said plurality of memory cells comprises an EEPROM.

97. The semiconductor memory device as set forth in claim 93, wherein:
each of said plurality of memory cells comprises a stacked capacitor cell.

98. The semiconductor memory device as set forth in claim 96, wherein:
said EEPROM is a flash EEPROM.

* * * * *